US010779066B1

(12) United States Patent
Moralejo et al.

(10) Patent No.: US 10,779,066 B1
(45) Date of Patent: Sep. 15, 2020

(54) PORTABLE RADIO WITH BUTTON OVER SPEAKER

(71) Applicant: MOTOROLA SOLUTIONS, INC., Chicago, IL (US)

(72) Inventors: Eduardo Moralejo, Miami, FL (US); Rammone Bartlett, Delray Beach, FL (US); Steven Gilmore, Plantation, FL (US); Kenney Koay, Penang (MY)

(73) Assignee: MOTOROLA SOLUTIONS, INC., Chicago, IL (US)

(*) Notice: Subject to any disclaimer, the term of this patent is extended or adjusted under 35 U.S.C. 154(b) by 0 days.

(21) Appl. No.: 16/370,072

(22) Filed: Mar. 29, 2019

(51) Int. Cl.
| H04R 1/02 | (2006.01) |
| H01H 13/14 | (2006.01) |
| H05K 1/18 | (2006.01) |
| H01H 13/50 | (2006.01) |
| H01H 13/06 | (2006.01) |
| H01R 13/24 | (2006.01) |
| H04R 3/00 | (2006.01) |
| G06F 3/16 | (2006.01) |
| H01H 13/20 | (2006.01) |

(52) U.S. Cl.
CPC ............ H04R 1/025 (2013.01); G06F 3/165 (2013.01); H01H 13/06 (2013.01); H01H 13/14 (2013.01); H01H 13/20 (2013.01); H01H 13/50 (2013.01); H01R 13/24 (2013.01); H04R 3/00 (2013.01); H05K 1/18 (2013.01); H04R 2400/11 (2013.01); H04R 2499/11 (2013.01); H05K 2201/10083 (2013.01)

(58) Field of Classification Search
None
See application file for complete search history.

(56) References Cited

U.S. PATENT DOCUMENTS

| 5,265,274 | A | 11/1993 | Knutson et al. | |
| 6,933,927 | B2 * | 8/2005 | Lu | G06F 1/1626 200/4 |
| 7,565,178 | B1 * | 7/2009 | Sitachitt | H04M 1/035 379/430 |
| 9,380,139 | B2 | 6/2016 | Kee et al. | |
| 2004/0081329 | A1 | 4/2004 | Huang et al. | |

(Continued)

FOREIGN PATENT DOCUMENTS

| DE | 112015005316 | 8/2017 |
| EP | 1542250 A1 | 6/2005 |
| WO | 2016085690 A1 | 6/2016 |

OTHER PUBLICATIONS

International Search Report and Written Opinion for Application No. PCT/US20201023932 dated Jun. 23, 2020 (13 pages).

Primary Examiner — James K Mooney
(74) Attorney, Agent, or Firm — Michael Best & Friedrich LLP

(57) ABSTRACT

A portable radio includes a printed circuit board, a frame positioned in front of the printed circuit board, a speaker positioned within the frame, a support platform positioned in front of the speaker and the frame, a button positioned in front of the support platform, and electrical components linked between the button and the printed circuit board. The button is movable between a first position where an electrical signal is sent through the plurality of electrical components to the printed circuit board, and a second position where the electrical signal is interrupted.

23 Claims, 6 Drawing Sheets

(56) References Cited

U.S. PATENT DOCUMENTS

| | | | |
|---|---|---|---|
| 2006/0050917 A1* | 3/2006 | Skillicorn | H04B 1/385 |
| | | | 381/384 |
| 2013/0176695 A1 | 7/2013 | Mittleman et al. | |
| 2016/0150303 A1* | 5/2016 | Tan | H04W 4/10 |
| | | | 381/334 |
| 2016/0217943 A1* | 7/2016 | Kim | H01H 13/86 |

* cited by examiner

PORTABLE RADIO WITH BUTTON OVER SPEAKER

BACKGROUND OF THE INVENTION

Portable radios commonly include buttons for controlling one or more features on the portable radios. These buttons are located along tops or sides of the portable radios. Placing a button elsewhere creates a challenge in terms of finding an electrical pathway to an interior of the portable radio. However, the desire for placing buttons elsewhere has grown. Accordingly, there is a need for an improved portable radio.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
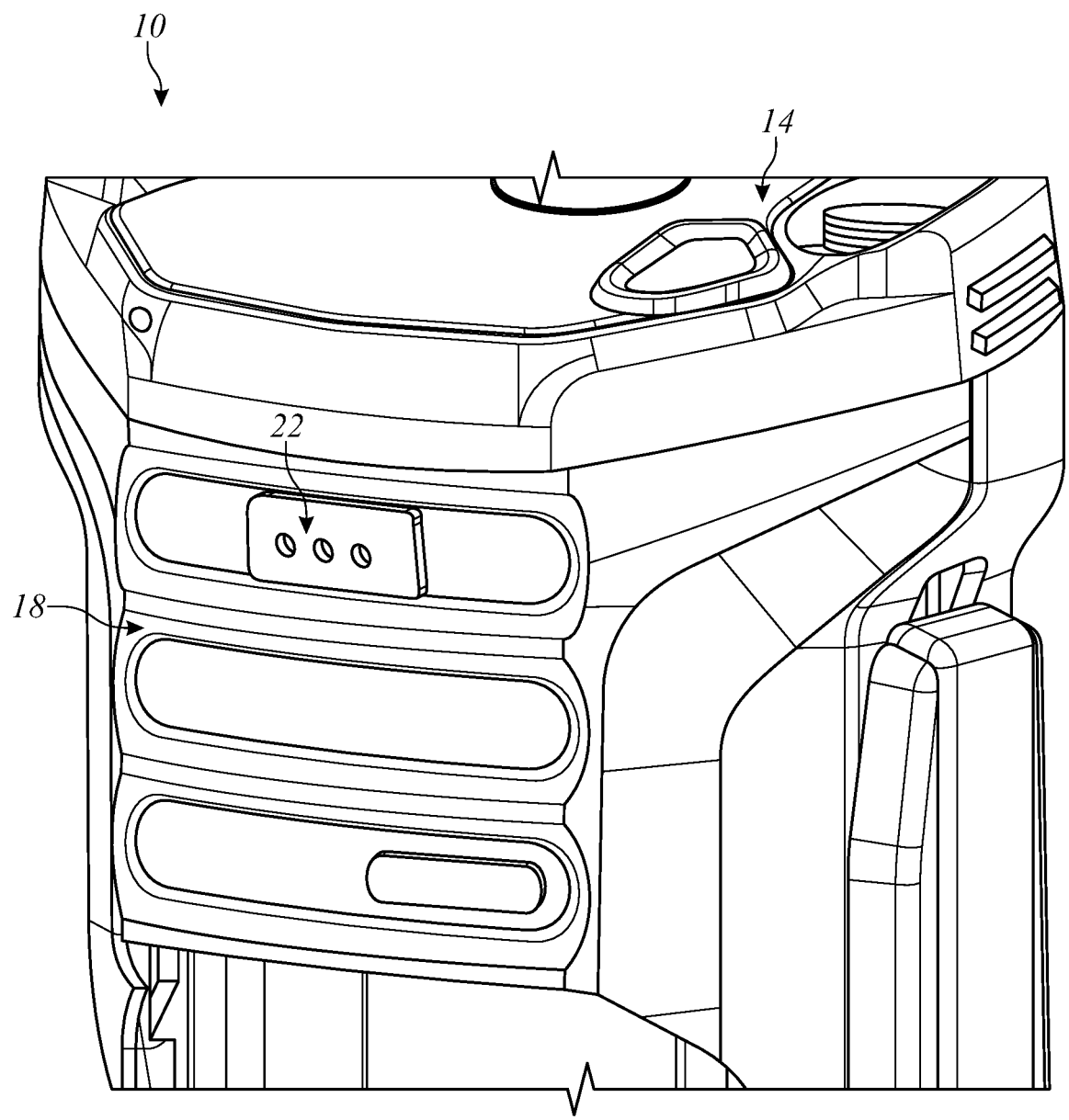
FIG. 1 is a front perspective view of a portion of a portable radio in accordance with one embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Briefly, there is provided herein an improved portable radio. A portable radio, in accordance with one embodiment, includes a printed circuit board, a frame positioned in front of the printed circuit board, a speaker positioned within the frame, a support platform positioned in front of the speaker and the frame, a button positioned in front of the support platform, and electrical components linked between the button and the printed circuit board. The button is movable between a first position where an electrical signal is sent through the plurality of electrical components to the printed circuit board, and a second position where the electrical signal is interrupted.

Figure 2:
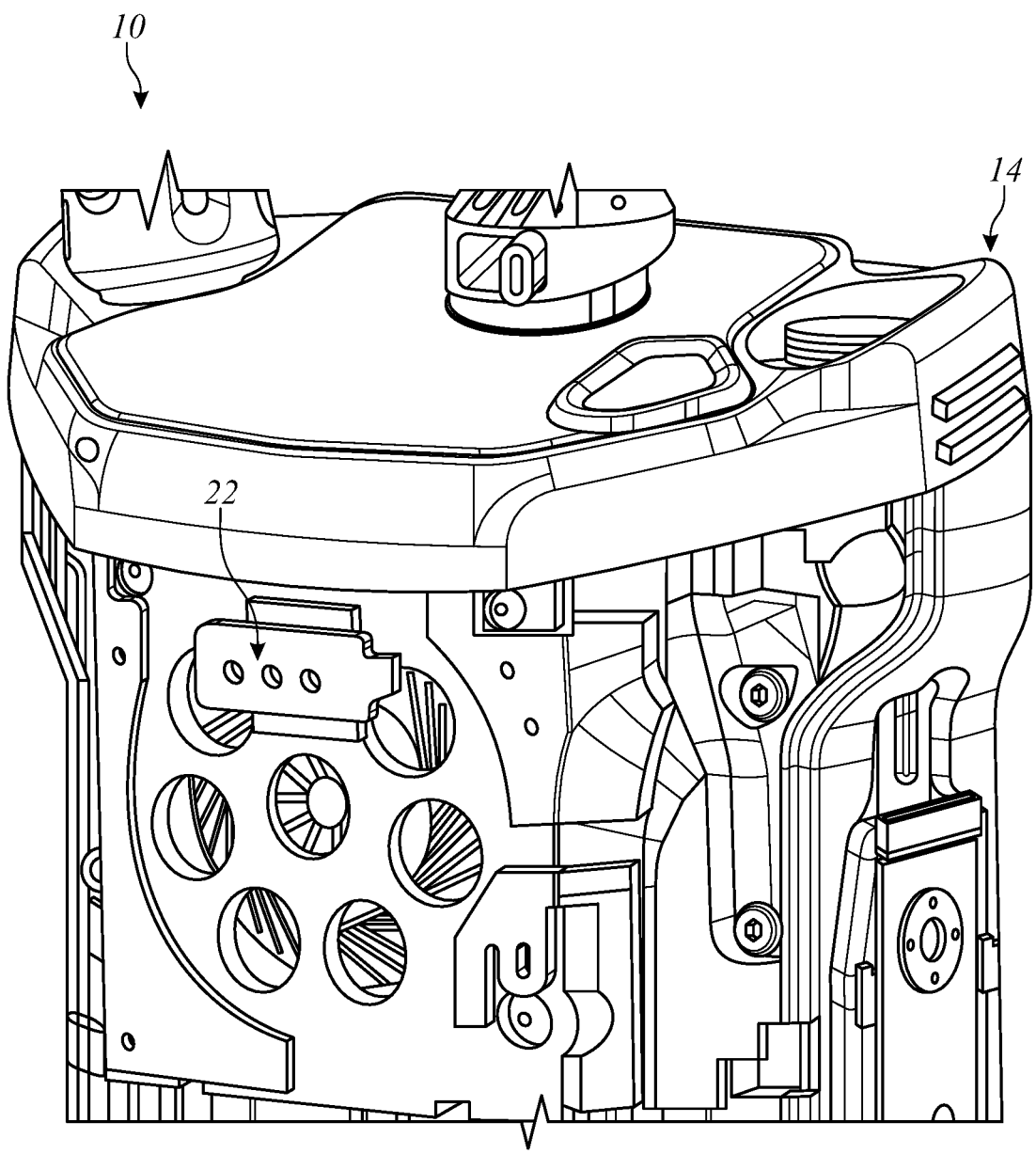
FIG. 2 is a perspective view of the portable radio of FIG. 1, with a speaker bezel removed.

FIGS. 1-6 illustrate one example of a portable radio 10. As illustrated in FIGS. 1 and 2, the portable radio 10 includes an outer housing 14, for example a rigid outer housing made of plastic. The outer housing 14 includes a speaker bezel 18 positioned along a front of the portable radio 10. The portable radio 10 also includes a button 22 that is positioned within an opening defined by the speaker bezel 18. A portion of the button 22 is exposed to an environment outside of the portable radio 10 and is visible when the speaker bezel 18 is attached to the rest of the portable radio 10 (FIG. 1).

Figure 3:
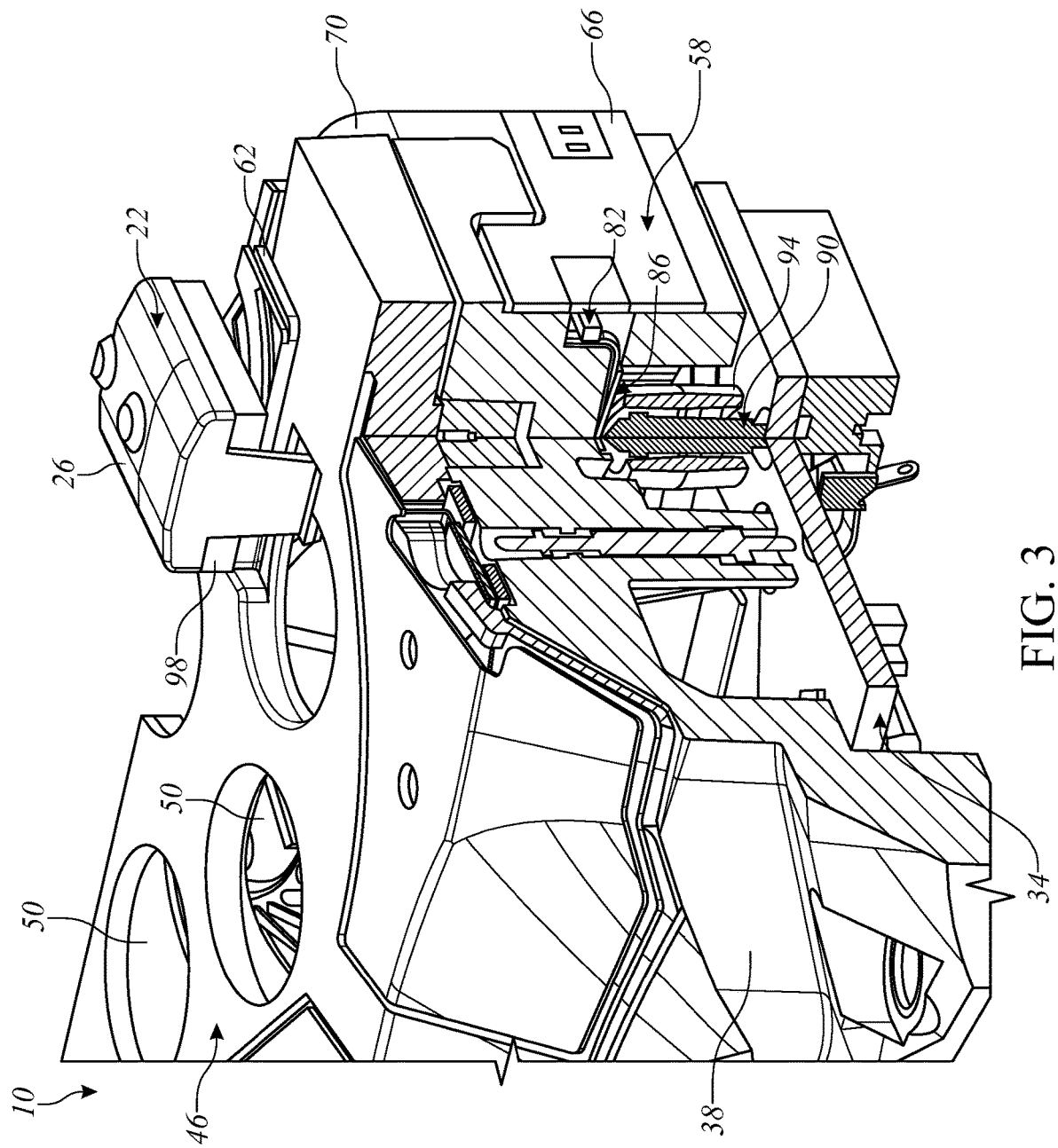
FIG. 3 is a front, right side perspective cross-sectional view of the portable radio of FIG. 2.
Figure 4:
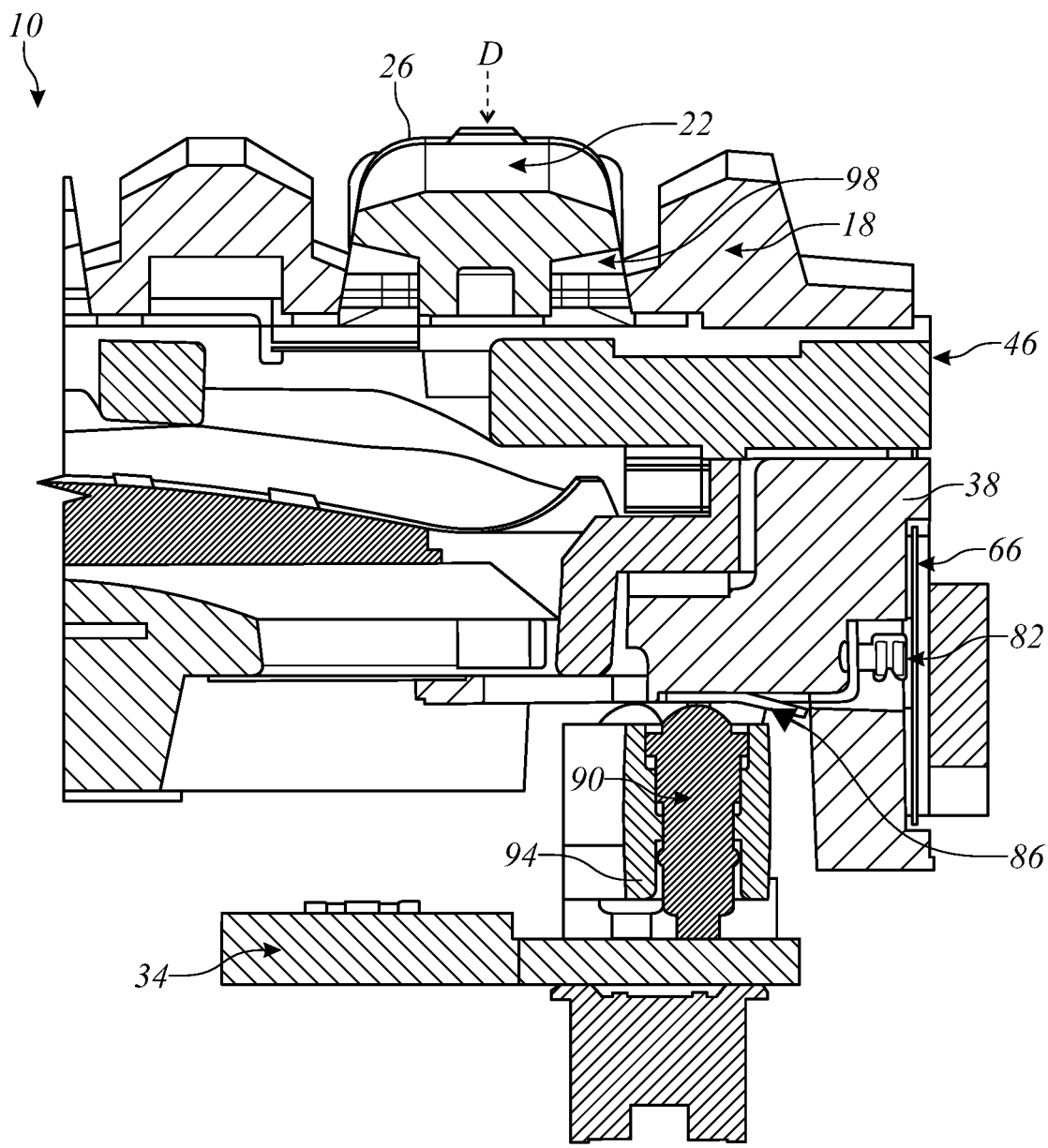
FIG. 4 is a right side cross-sectional view of the portable radio of FIG. 2.
Figure 5:
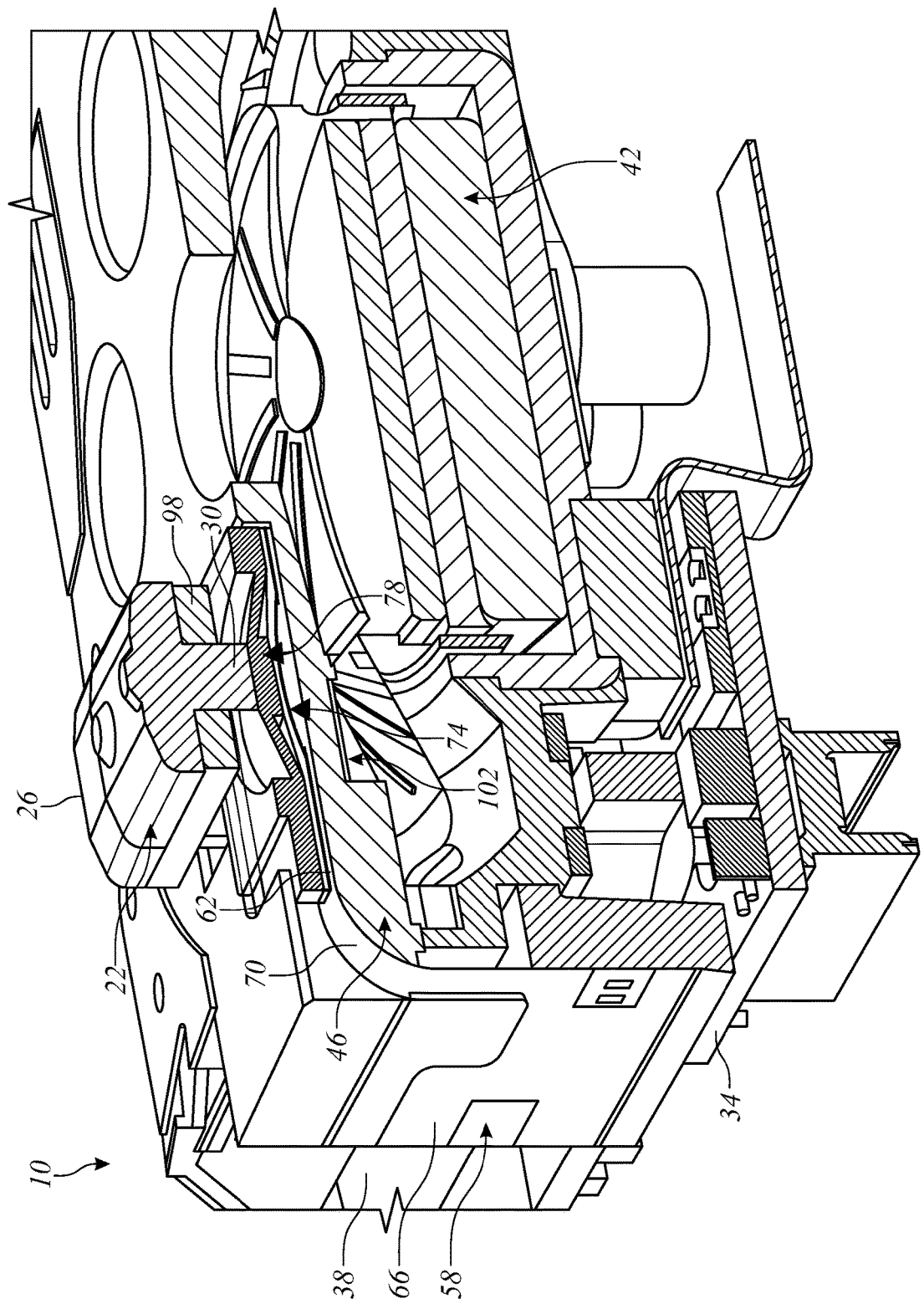
FIG. 5 is a front, left side perspective cross-sectional view of the portable radio of FIG. 2.
Figure 6:
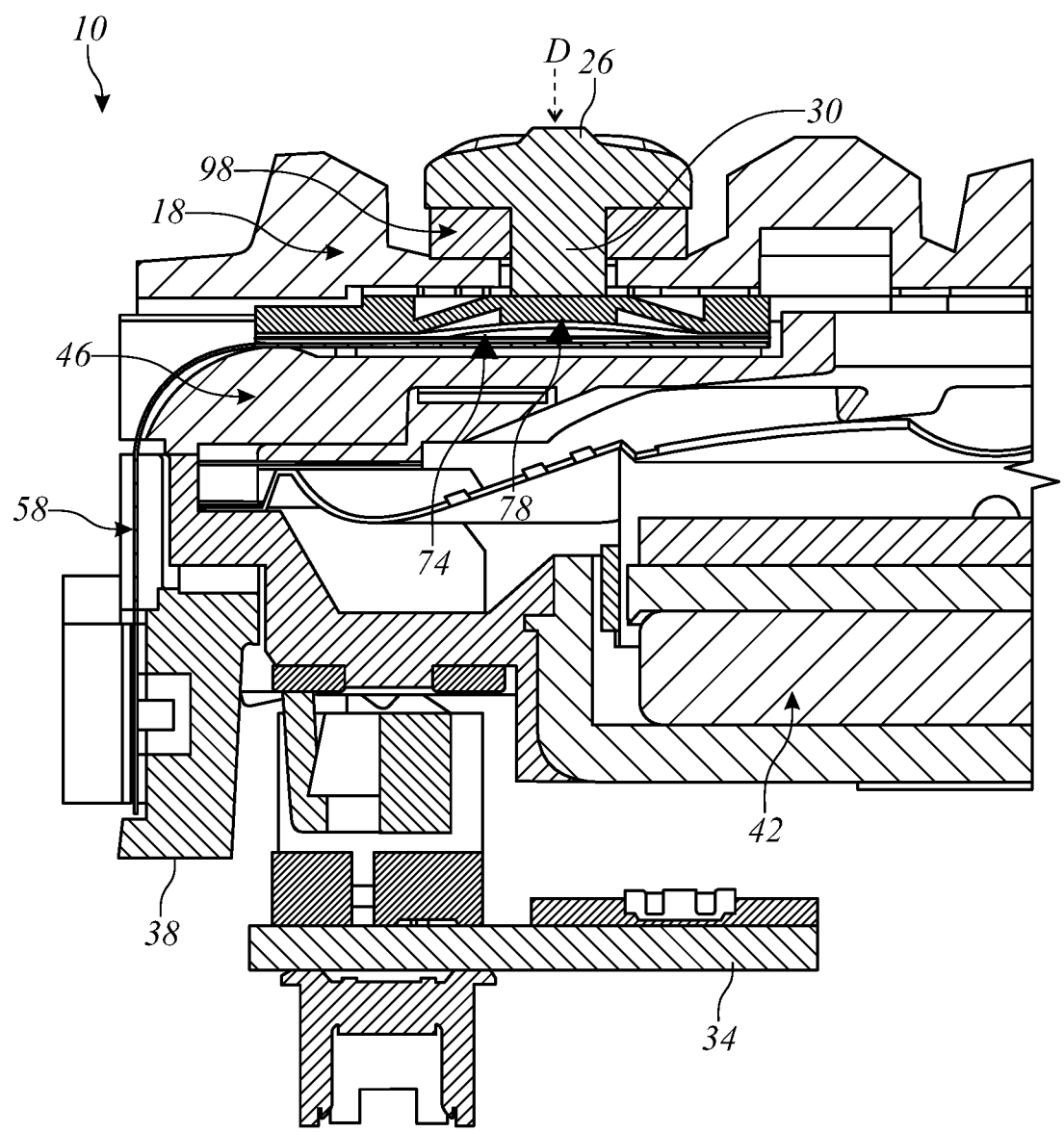
FIG. 6 is a left side cross-sectional view of the portable radio of FIG. 2.

With reference to FIGS. 3-6, the button 22 is movable, generally toward an interior of the portable radio 10 and away from the interior. In some embodiments the button 22 is biased (for example with a spring) in a direction away from the interior of the portable radio 10. In the illustrated embodiment the button 22 includes an outer region 26 (for example generally rectangular in shape) that may be pressed by the user during use. The button 22 further includes an inner region that extends from the outer region 26 and includes a plunger 30 (FIGS. 5 and 6). The plunger 30 is a projecting region of the button 22 that moves inwardly toward the interior of the portable radio 10 when the button 22 is pressed. The button 22 may have other shapes and sizes than that illustrated.

With continued reference to FIGS. 3-6, the button 22 is electrically coupled to a printed circuit board 34 within the interior of the portable radio 10. In the illustrated embodiment the portable radio 10 includes a frame 38 positioned in front of (i.e., exterior to) of the printed circuit board 34. A speaker 42 (FIGS. 5 and 6) is positioned within the frame 38. A support platform 46 is positioned in front of the speaker 42 and the frame 38. A portion of the support platform 46 is positioned over the speaker 42, and includes speaker ports 50 (FIG. 3). As illustrated in FIG. 3, antenna elements 54 (for example sheet metal antenna elements) may be positioned on regions of the support platform 46 adjacent the speaker ports 50. The antenna elements 54 may be electrically coupled to the printed circuit board 34 (for example through a separate electrical path other than that for the button 22).

With continued reference to FIGS. 3-6, the portable radio 10 includes a set of electrical components that are linked between the button 22 and the printed circuit board 34, such that a signal may be sent from the button 22 to the printed circuit board 34. In some embodiments, the portable radio 10 includes at least two, three, four, or in some cases at least five separate electrical components that are separately coupled to one another between the button 22 and the printed circuit board 34. In some embodiments, the electrical components cause the electrical signal to change directions at least two times, three times, or in some cases at least four times as the signal moves through the electrical components between the button 22 and the printed circuit board 34. The button 22 may be movable between a first position where the electrical signal is sent through the electrical components to the printed circuit board 34, and a second position where the electrical signal is interrupted.

In the illustrated embodiment, the set of electrical components includes an electrical flex element 58 coupled to the support platform 46 and to the frame 38. The electrical flex element 58 includes a first region 62 adhered to the support platform 46, and a second region 66 adhered to the frame 38. The electrical flex element 58 further includes a bent region 70 (for example a thin, curved strip) disposed between the first region 62 and the second region 66. As illustrated in FIGS. 3 and 5, the first region 62 extends along a first plane, and the second region 66 extends along a second plane that is perpendicular to the first plane. The bent region 70 is non-planar, and curves from the first plane to the second plane. In the illustrated embodiment the first plane is perpendicular to a direction of movement "D" (FIGS. 4 and 6) of the button 22, and the second plane is parallel to the direction of movement.

With reference to FIGS. 5 and 6, the set of electrical components further includes a tactile dome 74. The tactile dome 74 is positioned between the plunger 30 of the button 22 and the electrical flex element 58, and may have a dome-like or other shape that provides tactile feedback when pressed and released. When the button 22 is in a first position the tactile dome 74 is in a compressed state (is pressed down) and is in contact with the electrical flex element 58 for example to complete the electrical connection, and when the button 22 is in a second position the tactile dome 74 is in an uncompressed state (is raised up) and is out of contact with the electrical flex element 58 for example to interrupt the electrical connection. In some embodiments, and as illustrated in FIGS. 5 and 6, the portable radio 10 may also include a secondary plunger 78 (for example made of silicone) that is disposed directly behind (interior of) the plunger 30 of the button 22, and is positioned between the plunger 30 of the button 22 and the tactile dome 74. The secondary plunger 78 may form part of a larger silicone structure (or structure made of other soft material) that is coupled to the support platform 46.

With reference to FIGS. 3 and 4, the set of electrical components further includes a spring clip connector 82 that is coupled to the second region 66 of the electrical flex element 58, as well as a contact finger 86 coupled to the spring clip connector 82. The spring clip connector 82 is disposed between the electrical flex element 58 and the contact finger 86. In the illustrated embodiment the contact finger 86 has a ninety degree bend, although other embodiments include different shapes and sizes than that illustrated.

With continued reference to FIGS. 3 and 4, the set of electrical components further includes a pogo 90 coupled to both the contact finger 86 and to the printed circuit board 34. The pogo 90 extends in an elongate direction that is parallel to the direction of movement D of the button 22. The pogo 90 is disposed within a pogo housing 94, and slides within the pogo housing 94.

During use, when the button 22 is pressed the plunger 30 of the button 22 contacts and presses against the soft, secondary plunger 78, which in turn presses against the tactile dome 74. The tactile dome 74 is compressed, causing the tactile dome 74 to contact the first region 62 of the electrical flex element 58. This contact allows a signal to be sent through the electrical flex element 58, through the spring clip connector 82, through the contact finger 86, and through the pogo 90 and into the printed circuit board 34. The signal thus passes through various different electrical components, and changes direction as is moves generally from the button 22 on the exterior of the portable radio 10 to the interior of the portable radio 10 and to the printed circuit board 34.

In some embodiments, the portable radio 10 is interactive. For example, the button 22 may be a voice control button for establishing voice commands and information exchange with the portable radio 10 when the button 22 is pressed, although the button 22 may be used for any of a number of different purposes (for example power control, volume control, and the like). In the illustrated embodiment, when the button 22 is pressed a voice may emanate from the speaker 42. For example, the voice may say "Can I help you?" and the user may then ask the portable radio 10 a question (for example asking the portable radio 10 to run a license plate check, or to provide information regarding traffic conditions at a particular location). The portable radio 10 may then respond with the requested information.

With reference to FIGS. 3-6, in the illustrated embodiment the button 22 may be exposed to water and other outside environmental conditions, whereas the speaker 42 may be sealed from water within the frame. For example, the secondary plunger 78 and/or the tactile dome 74 may be sealed (with adhesive) to the first region 62 of the electrical flex element 58 (for example via a perimeter seal), and as described above the first region 62 may itself be sealed (with adhesive) to the frame 38 and to the support platform 46. As illustrated in FIGS. 3-6, in some embodiments a debris pad 98 is also coupled to the button 22. A portion of the debris pad 98 is positioned adjacent the plunger 30 of the button 22, and a portion of the debris pad 98 is in contact with an outer surface of the speaker bezel 18. Additionally, and with reference to FIG. 5, in the illustrated embodiment the portable radio 10 may include an air vent 102 disposed on the support platform 46. The air vent 102 permits passage of air from behind (interior of) the button 22 to an open region disposed behind the support platform 46.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A portable radio comprising:
a printed circuit board;
a frame positioned in front of the printed circuit board;
a speaker positioned within the frame;
a support platform positioned in front of the speaker and the frame, wherein the support platform includes a plurality of speaker ports;
a button positioned at least partially in front of the support platform and movable relative to the support platform along a first direction, wherein one of the plurality of speaker ports defines an axis that extends parallel to the first direction and passes through the speaker port, wherein the button is positioned relative to the plurality of speaker ports on the support platform such that the axis is spaced away from the button; and
a plurality of electrical components linked between the button and the printed circuit board;
wherein the button is movable along the first direction between a first position wherein an electrical signal is configured to be sent through the plurality of electrical components to the printed circuit board, and a second position wherein the electrical signal is configured to be interrupted.

2. The portable radio of claim 1, wherein the plurality of electrical components includes an electrical flex element coupled to the support platform.

3. The portable radio of claim 2, wherein the electrical flex element includes a first region adhered to the support platform, and a second region adhered to the frame.

4. The portable radio of claim 3, where the electrical flex element includes a bent region disposed between the first region and the second region.

5. The portable radio of claim 3, wherein the first region extends along a first plane, and the second region extends along a second plane that is perpendicular to the first plane.

6. The portable radio of claim 5, wherein the first plane is perpendicular to the first direction of movement of the button between the first position and the second position, and the second plane is parallel to the first direction of movement.

7. The portable radio of claim 2, wherein the button includes a plunger, and wherein the portable radio includes a tactile dome positioned between the plunger and the electrical flex element, wherein when the button is in the first position the tactile dome is configured to be in a compressed state, and when the button is in the second position the tactile dome is configured to be in an uncompressed state.

8. The portable radio of claim 7, further comprising a debris pad coupled to the button, wherein a portion of the debris pad is positioned adjacent the plunger.

9. The portable radio of claim 2, wherein the plurality of electrical components further includes a spring clip connector coupled to the electrical flex element.

10. The portable radio of claim 9, wherein the plurality of electrical components further includes a contact finger coupled to the spring clip connector.

11. The portable radio of claim 10, wherein the contact finger has a ninety degree bend.

12. The portable radio of claim 10, wherein the plurality of electrical components further includes a pogo coupled to both the contact finger and to the printed circuit board.

13. The portable radio of claim 12, wherein the pogo extends in an elongate direction, and wherein the first direction of movement of the button is parallel to the elongate direction.

14. The portable radio of claim 1, further comprising an air vent disposed on the support platform, wherein the air vent is configured to permit passage of air from behind the button to an open region disposed behind the support platform.

15. The portable radio of claim 1, further comprising a bezel positioned in front of the support platform, wherein the button is a voice control button coupled to the bezel.

16. The portable radio of claim 15, further comprising a debris pad coupled to the voice control button, wherein a portion of the debris pad is in contact with an outer surface of the bezel.

17. The portable radio of claim 1, wherein the plurality of electrical components includes at least five separate components electrically coupled to one another.

18. The portable radio of claim 1, wherein the electrical signal is configured to change directions at least four times as it moves through the plurality of electrical components.

19. The portable radio of claim 1, wherein the button is configured to be exposed to water, and the speaker is sealed from water within the frame.

20. The portable radio of claim 1, wherein the button does not include any speaker ports.

21. The portable radio of claim 1, wherein the plurality of speaker ports includes a central speaker port and additional speaker ports surrounding the central speaker port, wherein the central speaker port is the one of the plurality of speaker ports that defines the axis.

22. A portable radio comprising:
a printed circuit board;
a frame positioned in front of the printed circuit board;
a speaker positioned within the frame;
a support platform positioned in front of the speaker and the frame;
a button positioned in front of the support platform; and
a plurality of electrical components linked between the button and the printed circuit board;
wherein the button is movable between a first position wherein an electrical signal is configured to be sent through the plurality of electrical components to the printed circuit board, and a second position wherein the electrical signal is configured to be interrupted,
wherein the plurality of electrical components includes an electrical flex element coupled to the support platform, and wherein the electrical flex element includes a first region adhered to the support platform, and a second region adhered to the frame.

23. A portable radio comprising:
a printed circuit board;
a frame positioned in front of the printed circuit board;
a speaker positioned within the frame;

a support platform positioned in front of the speaker and the frame;

a button positioned in front of the support platform; and a plurality of electrical components linked between the button and the printed circuit board;

wherein the button is movable between a first position wherein an electrical signal is configured to be sent through the plurality of electrical components to the printed circuit board, and a second position wherein the electrical signal is configured to be interrupted, wherein the plurality of electrical components includes an electrical flex element coupled to the support platform, wherein the plurality of electrical components further includes a spring clip connector coupled to the electrical flex element, and wherein the plurality of electrical components further includes a contact finger coupled to the spring clip connector.

\* \* \* \* \*